(12) United States Patent
Gang et al.

(10) Patent No.: US 10,684,126 B2
(45) Date of Patent: Jun. 16, 2020

(54) APPARATUS AND METHOD FOR LAYER THICKNESS MEASUREMENT FOR A VAPOR DEPOSITION METHOD

(71) Applicant: Manz CIGS Technology GmbH, Schwabisch Hall (DE)

(72) Inventors: Matthias Gang, Michelbach a.d. Bilz (DE); Michael Pisch, Schwabisch Hall (DE); Michael Schafer, Altenstadt (DE); Jens Schuster, Gemmrigheim (DE); Ralf Sorgenfrei, Vorstetten (DE); Georg Voorwinden, Stuttgart (DE)

(73) Assignee: NICE SOLAR ENERGY GMBH, Schwäbisch Hall (DE)

( * ) Notice: Subject to any disclaimer, the term of this patent is extended or adjusted under 35 U.S.C. 154(b) by 0 days.

(21) Appl. No.: 15/519,137

(22) PCT Filed: Oct. 8, 2015

(86) PCT No.: PCT/EP2015/073304
§ 371 (c)(1),
(2) Date: Apr. 13, 2017

(87) PCT Pub. No.: WO2016/058905
PCT Pub. Date: Apr. 21, 2016

(65) Prior Publication Data
US 2017/0241776 A1 Aug. 24, 2017

(30) Foreign Application Priority Data
Oct. 14, 2014 (DE) .................. 10 2014 014 970

(51) Int. Cl.
*G01B 17/02* (2006.01)
*G01N 29/02* (2006.01)
(Continued)

(52) U.S. Cl.
CPC ............ *G01B 17/025* (2013.01); *C23C 14/24* (2013.01); *C23C 14/542* (2013.01);
(Continued)

(58) Field of Classification Search
CPC .................................................. G01B 17/025
See application file for complete search history.

(56) References Cited

U.S. PATENT DOCUMENTS

| 6,651,488 B2 | 11/2003 | Larson, III et al. | |
| 2002/0009545 A1* | 1/2002 | Hayashi | B05D 1/62 427/248.1 |

(Continued)

FOREIGN PATENT DOCUMENTS

| CN | 1063128 A | 7/1992 |
| CN | 1258324 A | 6/2000 |

(Continued)

OTHER PUBLICATIONS

European Patent Office (EPO), International Search Report for PCT/EP2015/073304 (published with WO 2016/058905 A1), dated Jan. 20, 2016 (Jan. 20, 2016), 2 pages, EPO, Rijswijk, NL.
(Continued)

*Primary Examiner* — Joseph A Miller, Jr.
(74) *Attorney, Agent, or Firm* — Christopher C. Dremann. P.C.; Christopher C. Dremann

(57) ABSTRACT

A measuring assembly and method for layer thickness measurement of a layer applied to a substrate by means of a vapor deposition method includes a measuring head which is provided with at least one vibration plate, an extraction line which can be coupled in a gas-conducting or vapor-conducting manner with a first end having a vacuum chamber for the vapor deposition method and which can be coupled in a gas-conducting or vapor-conducting manner with an opposite second end having the measuring head, (Continued)

wherein the extraction line includes at least one heating section or at least one cooling section.

15 Claims, 4 Drawing Sheets

(51) Int. Cl.
```
G01N 29/036    (2006.01)
G01N 29/12     (2006.01)
G01B 7/06      (2006.01)
C23C 14/54     (2006.01)
C23C 14/24     (2006.01)
C23C 16/52     (2006.01)
G01F 1/66      (2006.01)
```
(52) U.S. Cl.
CPC .......... *C23C 14/546* (2013.01); *C23C 16/52* (2013.01); *G01B 7/066* (2013.01); *G01F 1/662* (2013.01); *G01N 29/022* (2013.01); *G01N 29/036* (2013.01); *G01N 29/12* (2013.01); *G01N 2291/0256* (2013.01); *G01N 2291/02854* (2013.01); *G01N 2291/0426* (2013.01)

(56) References Cited

U.S. PATENT DOCUMENTS

| | | |
|---|---|---|
| 2003/0041654 A1 | 3/2003 | Larson, III et al. |
| 2003/0140858 A1 | 7/2003 | Marcus et al. |
| 2005/0217584 A1 | 10/2005 | Abiko et al. |
| 2007/0292610 A1 | 12/2007 | Abiko et al. |
| 2008/0156267 A1* | 7/2008 | Kido .................. C23C 14/044 118/724 |
| 2009/0061084 A1 | 3/2009 | Onuma et al. |
| 2010/0092665 A1 | 4/2010 | Sudou |
| 2012/0258239 A1 | 10/2012 | Hoffman |
| 2015/0079274 A1 | 3/2015 | Kakiuchi et al. |

FOREIGN PATENT DOCUMENTS

| | | |
|---|---|---|
| CN | 103270192 A | 8/2013 |
| CN | 104093877 A | 10/2014 |
| EP | 2 813 597 A1 | 12/2014 |
| JP | S60220810 A | 5/1985 |
| JP | H03097859 A | 4/1991 |
| JP | H11222670 A | 8/1999 |
| JP | 2004059981 A | 2/2004 |
| JP | 2005281808 A | 10/2005 |
| JP | 4174257 B2 | 10/2008 |
| WO | 2013/118341 A1 | 8/2013 |
| WO | WO2013/118341 * | 8/2013 |

OTHER PUBLICATIONS

The International Bureau of WIPO, International Preliminary Report on Patentability and Written Opinion of The International Searching Authority for PCT/EP2015/073304, dated Apr. 18, 2017 (Apr. 18, 2017) / Jan. 20, 2016 (Jan. 20, 2016), 8 pages, WIPO, Geneva, CH.

Japan Patent Office (JPO), Office Action Summary and Notice of Rejection for Application No. 2017-521149, dated Apr. 10, 2018 (Apr. 10, 2018), 3 pages.

Chinese Intellectual Property Office (CIPO), Search Report Issued in Counterpart Chinese Patent Application No. 2015800554984, dated Nov. 27, 2018 (Nov. 27, 2018), 2 pages.

China National Intellectual Property Administration, First Office Action Issued in Counterpart Chinese Patent Application No. 2015800554984, dated Dec. 5, 2018 (Dec. 5, 2018), 6 pages.

* cited by examiner

APPARATUS AND METHOD FOR LAYER THICKNESS MEASUREMENT FOR A VAPOR DEPOSITION METHOD

CROSS-REFERENCE TO RELATED APPLICATION

This United States non-provisional utility patent application is the national stage of International Application No. PCT/EP2015/073304 filed on Oct. 8, 2015, which claims the benefit of priority of German Application No. DE 10 2014 014 970.6 filed on Oct. 14, 2014, the entire disclosures of which are incorporated herein by reference.

FIELD OF THE INVENTION

The present invention relates to an apparatus, in particular to a measuring assembly, for measuring the layer thickness of a layer that is capable of being applied to a substrate by means of a vapor deposition method, and to a respective method for layer thickness measurement.

BACKGROUND OF THE INVENTION

In order for coating procedures of substrates by means of evaporative processes, or by means of vapor deposition methods, respectively, to be regulated and controlled it is necessary for the amount or the volumetric flow of the evaporating material that settles on the substrate to be measured. An evaporative process and consequently the entire coating process can be sufficiently monitored or controlled, respectively, by means of measurements of this type.

For some materials and elements, for example for selenium, it is known in principle for a proportion of the evaporated material to be extracted from a vapor chamber, typically from a vacuum chamber, and to be supplied to a vibration plate, typically to an oscillating crystal. The amount of the material that is deposited on the vibration plate leads to a modification of the resonance frequency of the vibration plate, said modification being electronically detectable. To this extent, the shift in the resonance frequency is a measure for the mass and the thickness of the layer accumulating on the vibration plate. To this extent, a volumetric flow of the evaporated material that has to be measured can be measured during the ongoing coating procedure by way of vibration plates of this type.

The vibration plate is to be disposed so as to be spaced apart from the vacuum chamber. Said vibration plate is typically to be coupled to the vacuum chamber in a gas-conducting or vapor-conducting manner by way of an extraction section. When extracting a vapor jet from the vacuum chamber it has to be guaranteed that an amount of the material vapor that is sufficient for a stable measuring signal is extracted. However, it can arise that a condensation temperature of the extracted vapor jet is undershot across the extraction section. Across the longitudinal extent of the extraction section this can lead to part of the material vapor that is propagated by way the extraction section condensing. Of course, such undesirable condensation leads to a distortion of the measuring signal.

It is to be furthermore noted that known vibration plates, typically in the form of quartz or other piezoelectric crystals, when subjected to continuous deposition of material, gradually lose their ability to vibrate in a required resonance range. To this extent, the service life of vibration plates of this type is heavily dependent on the amount of material that accumulates on the vibration plate.

Measuring installations which have a plurality of vibration plates which are impingeable in a sequential manner with the material vapor to be measured in order for the service life of known measuring assemblies to be prolonged are known. A plurality of such vibration plates herein is typically disposed on a rotatably mounted support of a turret measuring head. Individual vibration plates that are disposed on the support can be sequentially held in the extracted vapor jet or be positioned at that end of the extraction section that faces away from the vacuum chamber, respectively, by rotating the support.

Known turret measuring heads are often sealed only in an inadequate manner such that vibration plates that have not yet been used, prior to being employed are subjected to unintentional coating. On account thereof, not only are the measuring results distorted but the reproducibility of measurements, in particular when vibration plates are changed, can be compromised on account thereof.

The present invention is therefore based on the object of providing an improved measuring assembly for measuring the layer thickness of a layer that is capable of being applied to a substrate by means of a vapor deposition method. To this extent, the measuring assembly is intended to provide an inflow of vaporous or gaseous material, respectively, to the vibration plate that is as minor as possible yet stable and steady. The measuring assembly is intended to supply particularly precise measuring results and at the same time enable a comparatively long lifespan of the vibration plates that are to be used for measuring the layer thickness.

It is therefore a further objective to avoid or to suppress as far as possible any unintentional coating of vibration plates that are not yet located in the vapor jet, so as to enable more exact and more reproducible measurements in particular when vibration plates are changed, in order to ultimately simplify regulating and controlling of evaporative processes.

SUMMARY OF THE INVENTION

This object is achieved by a measuring assembly according to the present invention, and by a method for measuring the layer thickness according to the present invention. Advantageous exemplary design embodiments of a measuring assembly and method according to the present invention are shown and described herein.

To this extent, a measuring assembly for measuring the layer thickness of a layer that is capable of being applied to a substrate by means of a vapor deposition method is provided. The measuring assembly has a measuring head which is provided with at least one vibration plate, typically having an oscillating crystal plate or a piezoelectric crystal. The vibration plate has a resonance frequency that is capable of being determined by an electronic actuation or evaluation unit, said resonance frequency being modified as a material to be measured accumulates on the vibration plate. The electronic controller that is connected or coupled to the vibration plate is conceived for precisely measuring shifts in the resonance frequency of the vibration plate as a result of an accumulation of materials. The thickness of the layer that settles on the vibration plate is thus capable of being determined by means of associated evaluation electronics.

The measuring assembly is furthermore provided with an extraction section which by way of a first end is coupled or is capable of being coupled, respectively, in a gas-conducting or vapor-conducting manner to a vacuum chamber. The extraction section furthermore has a second end that is opposite the first end. The extraction section by way of the second end is capable of being coupled in a gas-conducting or vapor-conducting manner to the measuring head, or said extraction section is coupled in a gas-conducting or vapor-conducting manner to the measuring head, respectively. By means of the extraction section, a part-amount of the material that is evaporated in the vacuum chamber is capable of being transferred to a region outside the vacuum chamber, precise measuring of the layer thickness being able to be performed outside the vacuum chamber in said region.

The extraction section furthermore has at least one heating portion or at least one cooling portion. To this extent, the extraction section in regions or in portions is capable of being heated or cooled in a targeted manner. The amount of vapor that is to be supplied to the measuring head by way of the extraction section can be precisely regulated or controlled by means of a heater and/or cooler. Herewith, a formation of condensate can be largely avoided in the region of the extraction section, on the one hand.

At the same time, the amount of vapor that arrives at the vibration plate can be reduced to a required maximum size. Premature condensation of the vapor that is propagated by way of the extraction section can be counteracted by means of the heating portion. By way of the cooling portion it is possible in principle for the total amount of the vapor that arrives at the vibration plate to be reduced so as to prolong the life span and the service life of the vibration plate.

Depending on the use and on the purpose of application, and depending on the specific geometric design embodiment of the extraction section, it can suffice for the extraction section to have only one heating portion or only one cooling portion. The amount of vapor that is supplied to the vibration plate can be increased in principle by means of the heating portion and of active heating of the extraction section at least in portions. Alternatively or additionally thereto, should the amount of vapor or the volumetric flow, respectively, be excessive, monitored condensation of the vapor that is guided by way of the extraction section can be reduced directly upstream of the vibration plate such that only a reduced volumetric flow of the vapor arrives at the vibration plate per se.

It can be provided in particular that the extraction section has both at least one heating portion as well as at least one cooling portion. The propagation and flow behavior of the vapor that is extracted from the vacuum chamber can be monitored across the entire length of the extraction section by means of a combination of a heating and cooling portion.

As per a further design embodiment, the extraction section adjacent to the first end thereof has a heating portion. On account thereof it can be achieved that the vapor that exits from the vacuum chamber is not subjected to condensing at least at the entry of the extraction section such that almost all of the vapor that is extracted from the vacuum chamber and flows into the extraction section is capable of being conveyed completely and without any losses due to condensation by way of the extraction section to the vibration plate.

As per a further design embodiment, the extraction section adjacent to the second end thereof, that is to say so as to face the measuring head, has at least one cooling portion. By means of the cooling portion that is typically disposed downstream it is possible for the amount of vapor that is guided across or through the extraction section, or a corresponding volumetric flow, respectively, to be reduced to a required maximum size directly ahead of the measuring head and directly prior to impacting the vibration plate. By means of the cooling portion the volumetric flow of the vapor that arrives at the vibration plate is capable of being reduced to a fraction of the volumetric flow that is extracted from the vacuum chamber and is introduced into the first end of the extraction section. Said reduction of the amount of vapor or of the volumetric flow, respectively, contributes toward a prolongation of the life span and service life of the vibration plate.

The extraction section is advantageously provided with both a heating portion as well as a cooling portion. The heating portion and the cooling portion herein are mutually separated in the longitudinal direction of the extraction section. When viewed in the longitudinal direction of the extraction section, the heating portion and the cooling portion can also be directly adjacent or transition into one another. An end of the heating portion that faces the measuring head is advantageously directly adjacent to an end of the cooling portion that faces the vacuum chamber.

To this extent, the vapor that propagates through the extraction section is located either in the region of a heating portion or in the region of a cooling portion. In this way, the vapor that is directed by way of the extraction section in terms of the condensation behavior thereof can be monitored in the entire region between the vacuum chamber and the measuring head.

As per a further design embodiment, the extraction section has at least one gas-conducting or vapor-conducting tube that extends between the vacuum chamber and the measuring head. The tube in the region of the heating portion is surrounded by a heater. The heater can in particular be an electric heater having one or a plurality of heating coils which run outside the vapor-conducting tube of the extraction section but are advantageously thermally coupled to the vapor-conducting tube. In this way, the vapor-conducting tube can be maintained at a temperature level above the condensation temperature of the respective vapor.

Unintentional condensation of the vapor that flows through the tube on the internal walls of the tube can to this extent be reduced to a minimum or be entirely suppressed, respectively. Any potential cleaning effort for the extraction section and for the vapor-conducting tube can be reduced in this way. Maintenance intervals for the extraction section and the associated measuring assembly can be advantageously prolonged. On account thereof, the efficiency of a vacuum coating plant that is equipped therewith can be further increased.

As per a further design embodiment, the extraction section in the region of the cooling portion has a cooling trap having at least one side wall portion that is capable of being actively cooled. The cooling trap or the cooling portion that is formed by the cooling trap, respectively, is typically capable of being perfused or encircled by a cooling medium such that the cooling trap or the cooling portion, respectively, is capable of being cooled to a temperature level that is significantly lower than that of the heating portion. A defined part-amount of the vapor that is directed by way of the extraction section condenses in the region of the cooling portion and of the extraction section such that a volumetric flow of the vapor that in comparison to the first end of the extraction section is reduced by a predefined amount flows out at the second end of the extraction section downstream of the cooling portion.

It can be provided that the cooling portion and the heating portion are directly mutually adjacent such that the vapor flow that by way of the heating portion flows into the cooling portion is subjected to abrupt cooling and thus to monitored condensation on the internal walls of the cooling portion or of the cooling trap, respectively.

As per a further design embodiment, it is provided that an internal cross section of the cooling portion that is perfusable by gas or vapor is larger than an internal cross section of the heating portion that is perfusable by gas or vapor. The gas-conducting or vapor-conducting tube of the heating portion, in particular downstream, that is to say so as to face the measuring head and to face away from the vacuum chamber, can open into a radially extended tube, for instance, which forms the cooling portion of the extraction section.

On account of the internal cross section of the cooling portion being larger than the internal cross section of the heating portion, the internal surface of the actively cooled side wall portion of the cooling trap can be effectively enlarged in comparison to the heating portion. The condensation capacity of the cooling portion can be enlarged by an enlargement of this type of the side wall portion or of the entire internal wall face of the cooling portion, respectively, in relation to the length of the cooling portion in the flow direction.

To this extent, the cooling portion on the internal wall thereof can receive a comparatively large amount of the condensing vapor prior to the cooling properties of the cooling portion being potentially compromised for instance by an accumulation of a comparatively thick layer of the originally vaporous material.

As per a further design embodiment, the cooling portion and the heating portion of the extraction section are mutually separated in the longitudinal direction of the extraction section. Sequential thermal treatment of the vapor, specifically firstly heating or warming of the vapor, and subsequently monitored cooling or condensing, respectively, of the vapor can be achieved by a non-overlapping arrangement of the cooling portion and heating portion.

It is furthermore conceivable for the cooling portion and the heating portion, consequently the cooling trap and the heater, to be mutually insulated in thermal terms, such that an exchange of thermal energy between the cooling portion and the heating portion is effectively suppressed. Thermal decoupling of the cooling trap from the heating serves for improving the respective degree of efficiency of the cooling trap and the heating.

As per a further design embodiment, at least one heating output of the heating portion is capable of being regulated. Additionally or alternatively thereto, the cooling output of the cooling portion can also be designed so as to be capable of being regulated. The condensation and flow behavior of the vapor in the region of the extraction section can be monitored and regulated in a targeted manner by regulating the heating output and/or the cooling output, consequently by regulating the maximum and/or minimum heating or cooling temperature, respectively.

It can thus be achieved that almost the entire amount of vapor that is extracted from the vacuum chamber flows through the heating portion in an almost loss-free manner and to this extent reaches the cooling portion that is adjacent to the former in a loss-free manner. The volumetric flow of vapor that arrives in the region of the cooling portion, in a manner dependent on the set cooling output or cooling temperature, can then be reduced to a predefined size that prolongs the life span and the service life of the vibration plate.

Furthermore, a cooling or heating output that is constant across the service life of the measuring assembly can be brought about by regulating at least one of the heating portion or cooling portion. When a part-amount of the material vapor that flows by way of the extraction section settles on the internal wall of the cooling trap during the ongoing operation of the measuring assembly, this can compromise the cooling properties, in particular the thermal conductivity of the at least one side wall portion of the cooling trap that is capable of being actively cooled. An effect of this type can be counteracted by a regulating capability of the cooling trap.

As per a further design embodiment, it is provided that the heating portion occupies at least about 50% to about 90% of the overall length of the extraction section. It can accordingly be provided that the cooling portion occupies at most about 10% to about 50% of the overall length of the extraction section. To this extent, the heating portion in relation to the flow direction of the vapor can be designed to be significantly longer than the cooling portion. The heating portion serves in particular for conducting the vapor in a loss-free manner through the extraction section, while the cooling portion provides a defined reduction of the total volumetric flow of the gas only at that end of the heating portion that faces the measuring head.

Subdividing the extraction section into a heating portion and a cooling portion can vary so as to correspond to the geometric design embodiments of the heating portion and/or the cooling portion, in particular so as to depend on the internal cross section of the heating portion and the cooling portion. Subdividing the extraction section into a heating portion and a cooling portion can furthermore depend on the respective ongoing process and on the materials that are in the gaseous phase.

As per a further design embodiment, the measuring head has at least two or more vibration plates which are disposed on a rotatable support and are selectively movable into the region of a housing opening of the measuring head. The measuring head is designed in particular as a turret head such that a consumed or used vibration plate can be removed from the gas flow and a new vibration plate is capable of being disposed in the gas flow by rotating the measuring head about a predefined angular range.

By rotating the support, the vibration plates are capable of being successively brought into the region of a housing opening of the measuring head. The affected housing opening herein is disposed in the extension of the second end of the extraction section. As soon as a vibration plate is located in the region of the housing opening of the measuring head, the former is impingeable with the material vapor that has been conveyed by way of the extraction section.

As soon as a vibration plate loses its vibration properties, for instance by way of excessive accumulation of material, by rotating the support said vibration plate can be moved out of the region of the housing opening and a new unconsumed vibration plate can be brought into said region of the housing opening of the measuring head. By means of a turret measuring head of this type, vibration plates can be changed in a defined and reproducible manner, for instance in the ongoing operation of a coating procedure.

As per a further design embodiment, a sealing insert is inserted into the housing opening of the housing of the measuring head, said sealing insert in the interior of the housing being capable of coming to bear in a sealing manner on the support. Ingress of the vapor flow into the interior of the housing of the measuring head can be largely prevented by means of said sealing insert. In this way, vibration plates that have yet been unused and are disposed outside of the region of the housing opening of the measuring head can be effectively protected against premature accumulation of material vapor.

In particular, the space between the housing of the measuring head and the vibration plate that is disposed inside the housing is largely filled by means of the sealing insert. The sealing insert that is disposed on the housing can furthermore have a comparatively minor dynamic or static friction such that the support is rotatably mounted having as little friction as possible in the housing of the measuring head.

The sealing insert protrudes into the housing of the measuring head so far that only the vibration plate that is in the operative position or is disposed in the region of the housing opening, respectively, is impinged with material vapor, while all other vibration plates by way of the sealing insert in terms of flow technology are largely decoupled and separated from the vapor flow supplied.

As per a further design embodiment, the invention relates to a method for measuring the layer thickness of a layer that is capable of being applied to a substrate by means of vapor deposition. The method is the result of the application according to the intended use of the afore-described measuring assembly. To this extent, the implementation of the method for measuring the layer thickness is performed while using the afore-described measuring assembly.

Herein, it is provided in a first step that a vaporous or gaseous medium is extracted from a vacuum chamber and the vapor that is thereby extracted or the gaseous medium is directed into the extraction section. The extraction section is actively heated or actively cooled at least in portions. It can be provided in particular that a first portion of the extraction section is heated and a portion of the extraction section that is adjacent thereto in the longitudinal direction is actively cooled.

In a further step a vapor deposition rate is ultimately measured at the second end of the extraction section that faces away from the vacuum chamber. The modification in the vibration behavior of the vibration plate is measured in particular, this being a measure of the deposition rate or of the thickness of the layers that accumulate on the vibration plate, respectively. The thickness of the layer that accumulates on the vibration plate is a direct measure of the layer thickness on a substrate that is disposed within the vacuum chamber while said substrate is being subjected to a coating procedure.

Premature condensing of the material vapor that is to be guided by way of the extraction section can be counteracted by means of actively heating the extraction section at least in regions. Cooling of the extraction section in portions, in particular downstream of a heatable portion of the extraction section but upstream of the measuring head having the vibration plates disposed thereon, enables an advantageous reduction of the vapor deposition rate on the vibration plate.

Standardization or scaling of the layer that accumulates on the vibration plate can be performed in a manner corresponding to cooling of the cooling trap or to the specific configuration of the latter, respectively. The thickness of the layer that actually accumulates on the vibration plate can be a fraction of the layer that accumulates on the substrate within the vacuum chamber. A scaling or calibrating factor that correlates the layer thickness that is measurable on the vibration plate to the actual layer thickness on the substrate that is located within the vacuum chamber can vary in a manner corresponding to the configuration and the mode of operation of the cooling trap or of the cooling section of the extraction section, respectively.

A conclusion pertaining to the thickness of the layer that is actually present on the substrate can be drawn in a manner corresponding to previously carried out calibrating or scaling from the thickness of the layer that accumulates on the vibration plate and is measurable by means of the vibration plate.

Since the method for measuring the layer thickness relates substantially to the orderly operation of the afore-described measuring assembly, all features, effects, and advantages that have been described in the context of the measuring assembly also apply in the same way to the method for measuring the layer thickness, and vice versa.

BRIEF DESCRIPTION OF THE DRAWING FIGURES

Further objectives, features, and advantageous design embodiments of the invention will be explained in the detailed description hereafter of exemplary embodiments with reference to the accompanying drawing figures.

DETAILED DESCRIPTION OF EXEMPLARY EMBODIMENTS

Figure 1:
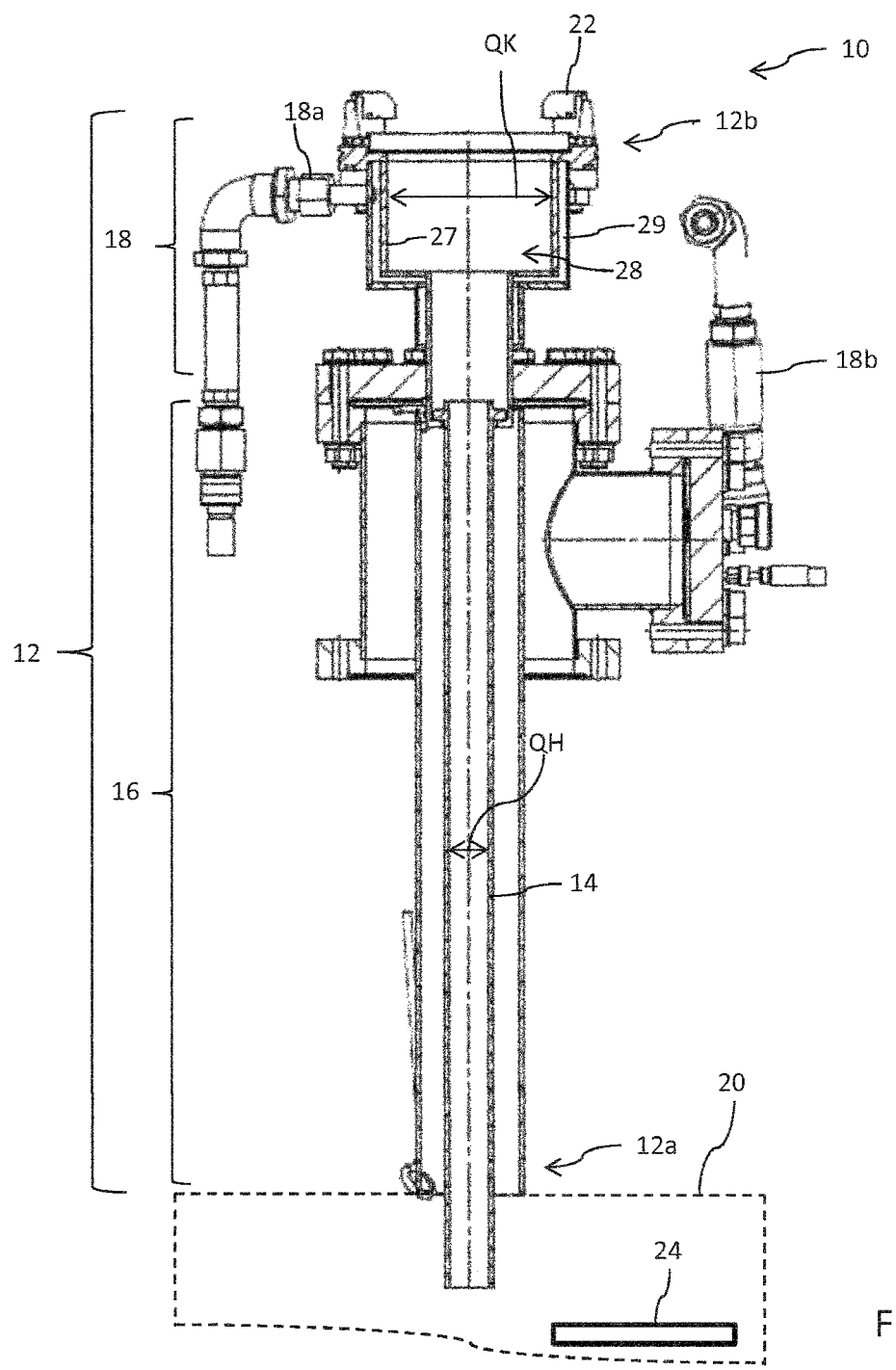
FIG. 1 shows a schematic illustration of an exemplary embodiment of the measuring assembly in a first cross section.
Figure 2:
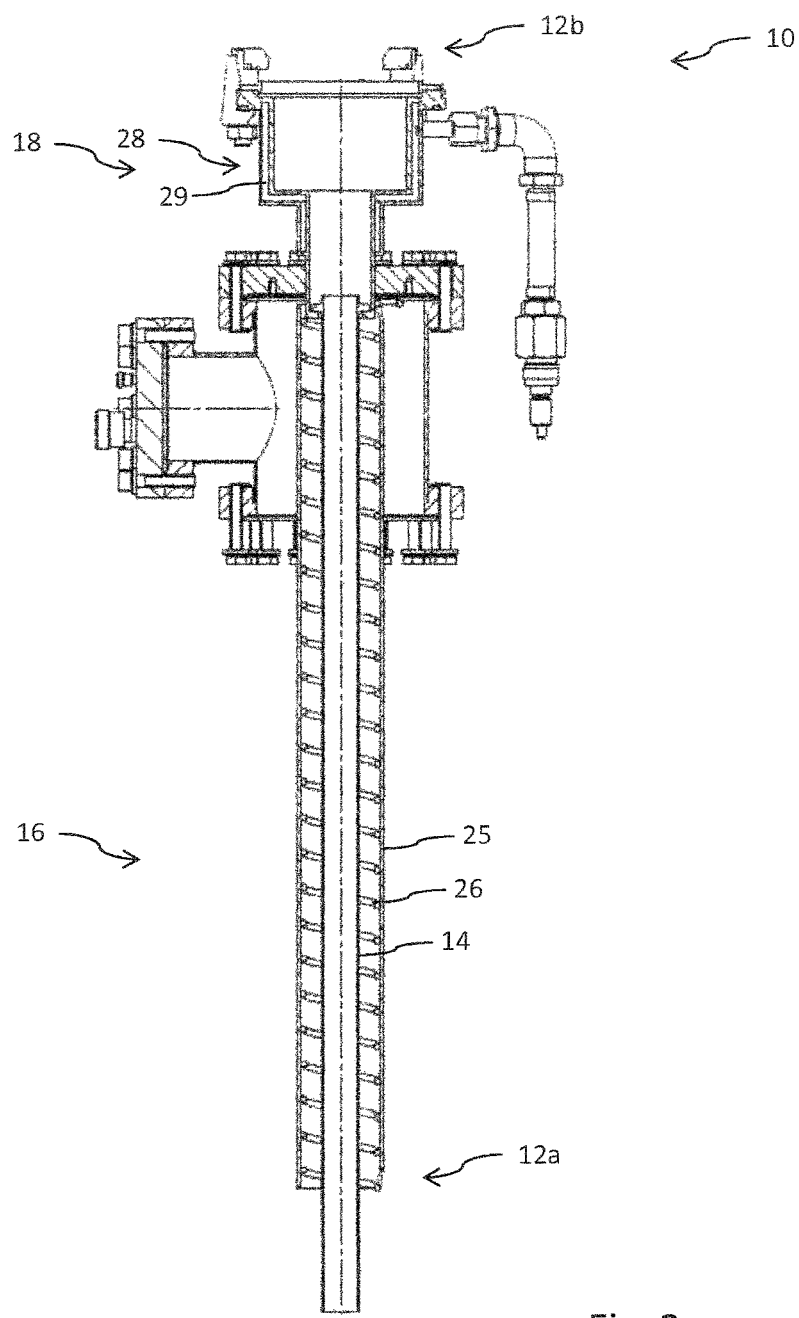
FIG. 2 shows a further schematic illustration of the measuring assembly in a second cross section.

A measuring assembly 10 for measuring the layer thickness of a layer that is capable of being applied to a substrate by means of vapor deposition is shown in FIGS. 1 and 2. The measuring assembly 10 is linked to the vacuum chamber 20 in which the substrate 24 that is to be typically applied is disposed. Within the vacuum chamber 20 the substrate is subjected to a surface-treatment process, for example a coating procedure. The coating methods can include the most diverse coating methods, typically physical or chemical vapor deposition methods. The vacuum chamber 20 is conceived for coating substrates for applications in displays or for solar cells, for example.

The vacuum chamber 20 can be configured in particular for generating a plasma that is provided for the coating process. To this extent, the vacuum chamber 20 is also suitable for plasma-facilitated coating methods. The vacuum chamber 20 is configured for coating substrates 24 with selenium, for example. The measuring assembly can serve inter alia for measuring the layer thickness of a selenium layer on the substrate 24 or on other layers that have already been applied to the substrate 24.

The measuring assembly 10 has an extraction section 12 which is capable of being coupled or is coupled, respectively, in a gas-conducting or vapor-conducting manner to the vacuum chamber 20. The extraction section 12 by way of a first end 12a is coupled in a gas-conducting or vapor-conducting manner to the vacuum chamber 20. Furthermore, the extraction section 12 by way of the end 12b thereof that faces away from the vacuum chamber 20, that is to say by way of a second end 12b, is capable of being coupled in a gas-conducting or vapor-conducting manner to the measuring head 30. In the present exemplary embodiment it is coupled permanently to the measuring head 30. As will yet be explained later with reference to FIGS. 3 and 4, the measuring head has at least one vibration plate 50, 52, the resonance or vibration behavior of the latter being electrically measurable, said resonance or vibration behavior being modified in a measurable manner as a result of an accumulation of material.

The vibration plate 50, 52 typically is cooled such that the vapor flow that is supplied to the vibration plate 50, 52 is subjected to condensation on the vibration plate, the vaporous or gaseous material as a result thereof accumulating on the vibration plate and thus modifying the vibration behavior of the latter in a measurable manner.

A proportion of the material vapor that is generated in the vacuum chamber 20 is capable of being diverted from the chamber 20 by means of the extraction section 12. Constant settling or constant condensing of the respective vaporous material within the chamber would not be implementable by virtue of the thermal conditions prevailing in said chamber. The vaporous or gaseous material by means of the extraction section 12 can be conveyed into a region that is remote from the vacuum chamber 20 and where the thermal conditions that are suitable for measuring the layer thickness and the respective pressure conditions can be created without adversely influencing the coating procedure per se that takes place in the vacuum chamber 20.

The extraction section 12 on the first end 12a thereof or adjacent to the latter has a heating portion 16 which is provided by means of a heater 26 shown in FIG. 2. In particular, the extraction section 12 has a vapor-conducting tube 14 which extends from the vacuum chamber 20 up to the measuring head 30. The tube 14 in the region of the heating portion 16 is surrounded by the heater 26. The heater 26 can have individual heat helix which at a predefined spacing wind themselves helically about the tube 14.

The heater 26 or the heating helix thereof, respectively, is presently disposed on the internal side of a sleeve 25 that encloses the tube 14. The tube 14 by means of the heater 26 can be maintained at a predefined temperature level such that premature condensing of the vaporous material that is guided in the tube is prevented.

A connector port 22 for a flow-technological coupling between the extraction section 12 and the measuring head 30 is provided on an end of the cooling portion 18 that faces away from the vacuum chamber 20. Furthermore, an inflow 18a and an outflow 18b for the cooling or chilling means are shown in the illustration according to FIGS. 1 and 2. Water at room temperature or below the latter can be considered as a suitable cooling or chilling means, for example. The cooling portion 18, the heating portion 16, and the inflow 18a and the outflow 18b are mechanically interconnected by means of flange plates 21, 23 that are mutually spaced apart in the longitudinal direction.

It can be clearly identified by means of FIGS. 1 and 2 that the cooling trap 28 that is provided at the downstream end of the extraction section 12 has an internal cross section QK which is larger than the internal cross section QH of the heating portion 16 that is upstream of QK. In relation to the length of the extraction section 12, the cooling portion 18 can provide an internal wall face that is larger than that of the heating portion 16 and thus provide a comparatively high cooling output per unit length. By way of the enlarged internal surface per unit length of the cooling portion 18 as compared to that of the heating portion 16, cooling that is unabated or is barely compromised by condensation of the cooling portion 18 can be performed even in the case of condensation setting in on the internal walls of said portion.

The combination of the heating portion 16 and a cooling portion 18 disposed downstream is advantageous to the extent that a formation of condensate along the extraction section 12 is largely suppressed by means of the heating portion, and almost all vapor that is extracted from the vacuum chamber 20 can thus be conveyed to that end of the heating portion 16 that faces away from the vacuum chamber 20. Condensing of the supplied material vapor that is monitored or is capable of being regulated, respectively, can take place there as the vapor arrives in the cooling portion 18, in order for the total amount of condensate on the vibration plate 50, 52 to be reduced to a minimum.

A steady and uninterrupted vapor flow can be guided into the region of the vibration plate 50, 52 by means of the heating portion 16. The total amount or the condensation rate of the vaporous medium on the vibration plate 50, 52 can be reduced to a minimum by means of the cooling portion 18 and of the cooling trap 28 that is provided with a cooler 29. In this way, the life span and the service life of the vibration plate 50, 52 can advantageously be prolonged.

The length of the heating portion 16 is typically larger than the length of the cooling portion 18 that in the longitudinal direction is adjacent to the former. The heating portion 16 is typically at least twice, three times, or four times the length of the cooling portion 18. The specific geometric design embodiment and dimensioning of the heating portion 16 and the cooling portion 18 can be adapted to the respective process in the vacuum chamber 20 as well as to the material to be measured. In particular, the layer thickness of a selenium layer on a substrate 24 can be measured by means of the measuring assembly 10 described here.

Figure 3:
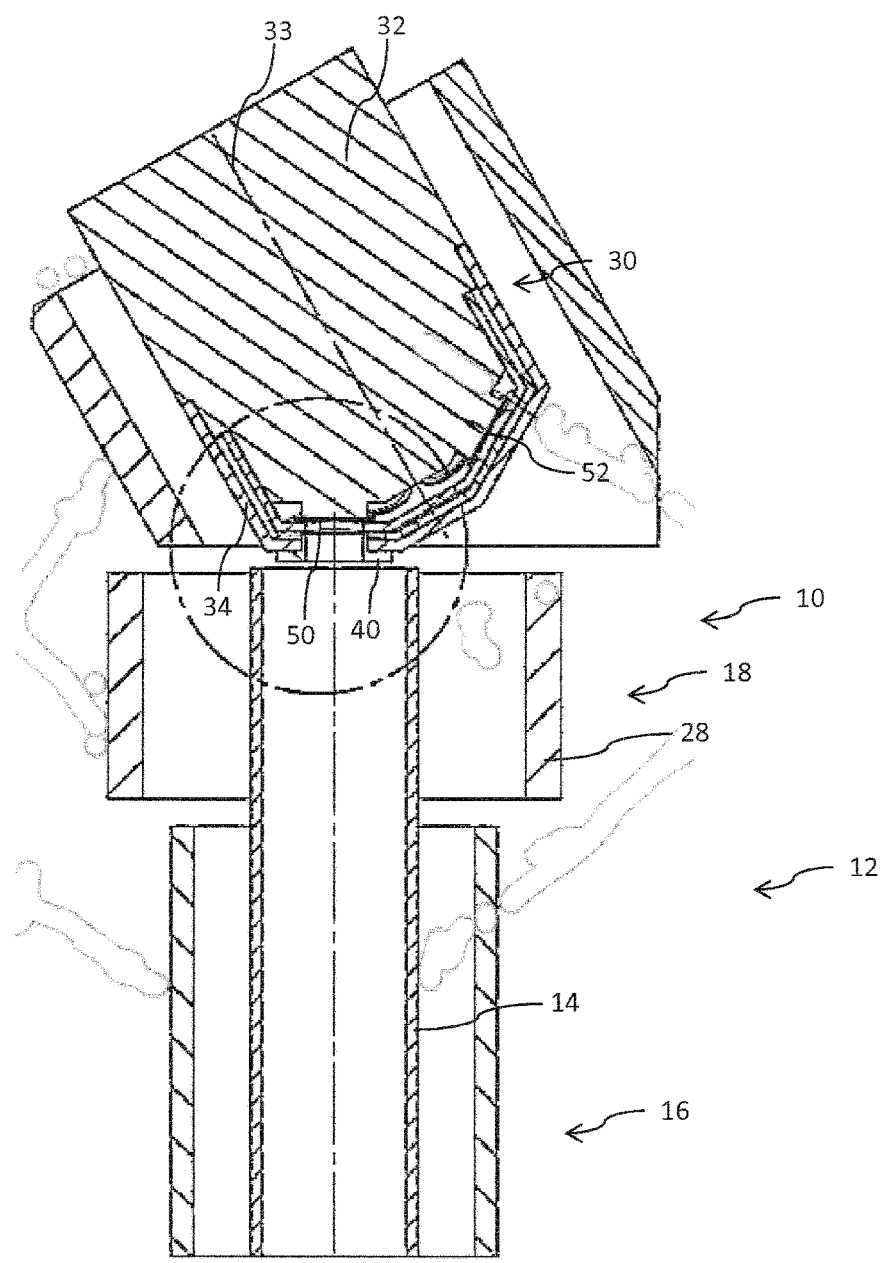
FIG. 3 shows an enlarged diagram of the second end of the extraction section of the measuring assembly.

In the design embodiment according to FIG. 3 the vapor-conducting tube 14 is illustrated as a single tube that extends directly from the vacuum chamber 20 up to the measuring head 30 and which in the region of the heating portion 16 and in the region of the cooling portion 18 has a tubular geometry that is identical in each case. However, the tube 14 in the region of the cooling portion 18 is cooled while said tube 14 in the region of the heating portion 16 is warmed or heated, respectively.

By contrast, the alternative design embodiment according to FIGS. 1 and 2 provides a design embodiment of the vapor-conducting extraction section 12 in two parts. There, the vapor-conducting tube 14 at the downstream end of the heating portion 16 transitions into the radially extended cooling portion 18.

Figure 4:
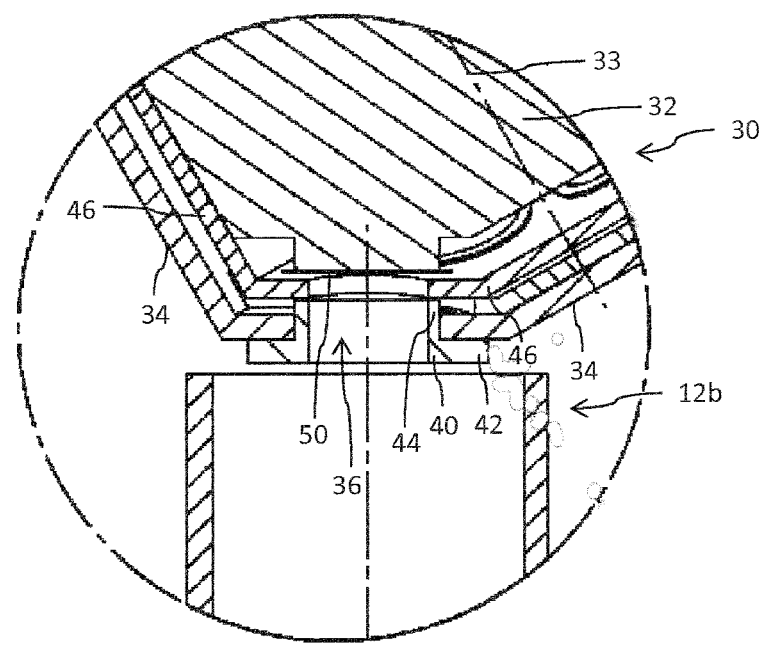
FIG. 4 shows a further enlarged illustration of a transition region between the extraction section and the measuring head of the measuring assembly.

The tube 14, or the extraction section 12 that is formed by the former, respectively, at the end at the side of the measuring head is designed so as to be largely open, as can be derived from the enlarged illustration of FIG. 4. The exit of the extraction section 12, or the second end 12b of the extraction section 12, respectively, is disposed so as to be approximately in line with a housing opening 36 of the housing 34 of the measuring head. The measuring head 30 in the interior of the housing 34 thereof has a rotatably mounted support 32 which between various discrete positions is rotatable or adjustable, respectively, in relation to a rotation axis 33.

In the position illustrated in FIGS. 3 and 4, the support 32 is aligned in such a manner in the housing 34 that a vibration plate 50 that is disposed on the support 32 comes to lie so as to be approximately in line with the housing opening 36. The respective vibration plate 50 is thus exposed to the material vapor that is supplied by way of the extraction section 12. The vibration plate 50, configured as a quartz plate, for example, can be excited to perform vibrations, the frequency of the latter being measurably modified as previously vaporous condensed material accumulates.

At least one further vibration plate 52 which in the illustration according to FIG. 3 comes to lie in a region in the interior of the housing 34 that is outside the housing opening 36 is disposed on the support 32.

The housing opening 36 is furthermore provided with an insert 40, said insert functioning as a sealing insert. The latter has an outwardly protruding flange portion 42 which in the fitted position shown in FIG. 4 bears from the outside on the periphery of the housing opening 36.

The sealing insert 40 is furthermore provided with a port 44 that protrudes into the housing opening 36. The port 44 by way of the free end thereof that protrudes into the housing 34 comes to bear on a seal 46 which is configured as a sealing disk, for example, and is disposed on the internal side of the housing 34. The sealing insert 40 and the seal 46 are capable of being brought to bear on one another in a gas-tight or fluid-tight manner such that the vibration plate 52 that is disposed outside the housing opening 36 and in the interior of the housing 34 is largely protected against material vapor that intrudes into the housing 34.

The seal 46 or the annular seal, respectively, is typically provided with a material having positive friction properties such that a sealing arrangement between the seal 46 and the sealing insert 40 can be achieved in a relatively simple manner and with low friction. The provision of the seal 46 in the gap between the housing 34 of the measuring head 30 and the support 32 that is rotatably mounted in the former can furthermore largely suppress any dissemination of the material vapor in the interior of the housing 34. The vibration plates 52 that are not in the operative position can thus be largely protected against premature condensing of material vapor.

The housing 34, the support 32, and the measuring head are typically made from a heat-resistant and acid-resistant material, for example from a steel of corresponding grade. The seal 46 can be made from pyrolytic boron nitride (PBM) or polyether ether ketone (PEEK), for example.

The use of materials that have a resistance of this type and advantageously have low friction for the housing 34, the support 32, for the sealing insert 40 and the seal 46 at the side of the housing, enable a free-moving replacement of vibration plates 50, 52 by rotating the support 32 relative to the housing 34. Furthermore, said materials of the measuring assembly 10 impart a high life span and service life.

Should a vibration plate 40 that is in the operative position in FIG. 4 be populated with condensed material in such a manner that said vibration plate 40 loses its vibration properties, another new vibration plate 52 can be moved into the operative position on the housing opening 36 by simply rotating the support 32 in relation to the housing 34.

The cooling portion of the extraction section is to be positively separated from any cooling of the vibration plate per se that is disposed in or on the measuring head. The vibration plate is typically cooled in a separate manner in order for the vaporous or gaseous material to condense thereon. The cooling portion of the extraction section is upstream in relation of the measuring head and of the vibration plate that is disposed thereon, such that a defined part-amount of the volumetric flow of the vapor that flows by way of the extraction section condenses in the region of the cooling portion and thus upstream of the vibration plate. The total amount of the material that accumulates on the vibration plate can be reduced by a predefined size in this way.

The extraction section 12 furthermore has a cooling portion 18 which is located at the second end 12b of the extraction section 12. The cooling portion 18 can be directly adjacent to the heating portion 16. Said cooling portion 18 can however also be designed so as to be separate from the latter or so as to be thermally decoupled from the heating portion 16. The cooling portion 18 is designed in particular as a cooling trap 28 and is provided with a dedicated cooler 29. In particular, the cooler 29 can have a cavity structure in at least one side wall 27 of the cooling portion 18. Said cavity structure can be impinged by a cooling medium and accordingly be perfused by a cooling medium that is at a predefined temperature level, for example.

Should a vibration plate 50 that is in the operative position in FIG. 4 be populated with condensed material in such a manner that said vibration plate 50 loses its vibration properties, another new vibration plate 52 can be moved into the operative position on the housing opening 36 by simply rotating the support 32 in relation to the housing 34.

The invention claimed is:

1. A measuring assembly for measuring a layer thickness of a layer applied to a substrate by vapor deposition in a vapor deposition apparatus, said measuring assembly comprising:
    a measuring head provided with at least one vibration plate; and
    an extraction section comprising a tube that is at least one of gas-conducting and vapor-conducting, the tube having a first end and a second end opposite the first end, wherein the first end is capable of being coupled in at least one of a gas-conducting manner and a vapor-conducting manner to a side wall of a vacuum chamber of the vapor deposition apparatus such that the second end is located outside the vacuum chamber, wherein the second end is capable of being coupled in at least one of a gas-conducting manner and a vapor-conducting manner to the measuring head disposed outside the vacuum chamber, and wherein the tube is configured to couple the vibration plate to an interior of the vacuum chamber in at least one of a gas-conducting manner and a vapor-conducting manner;
    wherein the extraction section has at least a cooling portion adjacent to and downstream of the second end of the tube and wherein the cooling portion has a cooling trap having at least one side wall portion that is capable of being actively cooled, wherein an internal cross section of the cooling portion or of the cooling trap is larger than an internal cross section of the tube.

2. The measuring assembly as claimed in claim 1, wherein the extraction section adjacent to the first end of the tube has a heating portion surrounded by a heater.

3. The measuring assembly as claimed in claim 2, wherein the cooling portion and the heating portion are mutually separated in a longitudinal direction of the extraction section.

4. The measuring assembly as claimed in claim 2, wherein at least one of a heating output of the heating portion and a cooling output of the cooling portion is regulated by at least one of the heater and the cooling trap.

5. The measuring assembly as claimed in claim 2, wherein the heating portion occupies at least about 50% to about 90% of an overall length of the extraction section.

6. The measuring assembly as claimed in claim 1, wherein the cooling portion occupies at most about 10% to about 50% of an overall length of the extraction section.

7. The measuring assembly as claimed in claim 1, wherein the measuring head has at least two vibration plates disposed on a rotatable support and selectively movable into a region of a housing opening of a housing of the measuring head, said housing opening being disposed in an extension of the second end of the tube of the extraction section.

8. The measuring assembly as claimed in claim 7, wherein a sealing insert is inserted into the housing opening of the housing of the measuring head and in an interior of the housing is capable of coming to bear in a sealing manner on the support.

9. A method for measuring a layer thickness of a layer applied to a substrate by vapor deposition in a vapor deposition apparatus, using the measuring assembly as claimed in claim 1, the method comprising:
   extracting a material vapor from the vacuum chamber and directing the extracted material vapor into the extraction section;
   actively cooling the cooling portion of the extraction section; and
   measuring a vapor deposition rate on the second end of the tube of the extraction section by means of the at least one vibration plate.

10. A vapor deposition apparatus comprising a vacuum chamber and configured to apply a layer onto a substrate by vapor deposition within the vacuum chamber, the vapor deposition apparatus comprising a measuring assembly for measuring a layer thickness of the layer, the measuring assembly comprising:
   a measuring head provided with at least one vibration plate; and
   an extraction section comprising a tube that is at least one of gas-conducting and vapor-conducting, wherein the tube has a first end and a second end opposite the first end, the first end being connected to a side wall of the vacuum chamber and the second end being arranged outside the vacuum chamber and connected to the measuring head disposed outside the vacuum chamber, and wherein the tube is configured to couple the vibration plate to an interior of the vacuum chamber in at least one of a gas-conducting manner and a vapor-conducting manner;
   wherein the extraction section has at least a cooling portion adjacent to and downstream of the second end of the tube and wherein the cooling portion has a cooling trap having at least one side wall portion that is capable of being actively cooled, wherein an internal cross section of the cooling portion or of the cooling trap is larger than an internal cross section of the tube.

11. A measuring assembly for measuring a layer thickness of a layer applied onto a substrate by vapor deposition in a vapor deposition apparatus, said measuring assembly comprising:
   a measuring head provided with at least one vibration plate; and
   an extraction section comprising a sleeve and a tube, wherein the tube is at least one of gas-conducting and vapor-conducting and wherein the sleeve encloses the tube, wherein the tube has a first end and a second end opposite the first end, the first end being connectable to the vacuum chamber such that the second end is arranged outside the vacuum chamber, wherein the second end is connected to the measuring head disposed outside the vacuum chamber and wherein the tube is configured to couple the vibration plate to an interior of the vacuum chamber in at least one of a gas-conducting manner and a vapor-conducting manner; and
   wherein the extraction section adjacent to the first end of the tube has a heating portion located outside the vacuum chamber and wherein the heating portion is surrounded by a heater disposed on an internal side of the sleeve.

12. A vapor deposition apparatus comprising a vacuum chamber and configured to apply a layer onto a substrate by vapor deposition within the vacuum chamber, the vapor deposition apparatus comprising a measuring assembly for measuring a layer thickness of the layer, the measuring assembly comprising:
   a measuring head provided with at least one vibration plate; and
   an extraction section comprising a sleeve and a tube, wherein the tube is at least one of gas-conducting and vapor-conducting and wherein the sleeve encloses the tube, wherein the tube has a first end and a second end opposite the first end, the first end being connected to the vacuum chamber and the second end being arranged outside the vacuum chamber and connected to the measuring head, and wherein the tube is configured to couple the vibration plate to an interior of the vacuum chamber in at least one of a gas-conducting manner and a vapor-conducting manner; and
   wherein the extraction section adjacent to the first end of the tube has a heating portion located outside the vacuum chamber and wherein the heating portion is surrounded by a heater disposed on an internal side of the sleeve.

13. A measuring assembly for measuring a layer thickness of a layer applied onto a substrate by vapor deposition in a vapor deposition apparatus, said measuring assembly comprising:
   a measuring head provided with at least one vibration plate; and
   an extraction section comprising a tube which is at least one of gas-conducting and vapor-conducting, wherein the tube comprising a first end and a second end opposite to the first end, the first end is capable of being coupled in at least one of a gas-conducting and a vapor-conducting manner to a vacuum chamber of the vapor deposition apparatus, wherein the second end is capable of being coupled in at least one of a gas-conducting and a vapor-conducting manner to the measuring head, and wherein the tube is configured to couple the vibration plate to an interior of the vacuum chamber in at least one of a gas-conducting manner and a vapor-conducting manner;
   wherein the measuring head has at least two vibration plates disposed on a rotatable support and selectively movable into a region of a housing opening of a housing of the measuring head, said housing opening being disposed in an extension of the second end of the tube of the extraction section.

14. A vapor deposition apparatus comprising a vacuum chamber and configured to apply a layer onto a substrate by vapor deposition when arranged inside the vacuum chamber, the vapor deposition apparatus comprising a measuring assembly for measuring a layer thickness of the layer, the measuring assembly comprising:
   a measuring head provided with at least one vibration plate; and
   an extraction section comprising a tube that is at least one of gas-conducting and vapor-conducting, wherein the tube has a first end and a second end opposite the first end, the first end being connected to the vacuum chamber and the second end being arranged outside the vacuum chamber and connected to the measuring head, and wherein the tube is configured to couple the vibration plate to an interior of the vacuum chamber in at least one of a gas-conducting manner and a vapor-conducting manner;

wherein the measuring head has at least two vibration plates disposed on a rotatable support and selectively movable into a region of a housing opening of a housing of the measuring head, said housing opening being disposed in an extension of the second end of the tube of the extraction section.

15. The measuring assembly as claimed in claim 13, wherein a sealing insert is inserted into the housing opening of the housing of the measuring head and in an interior of the housing is capable of coming to bear in a sealing manner on the support.

* * * * *